United States Patent
Ito et al.

(10) Patent No.: US 8,939,628 B2
(45) Date of Patent: Jan. 27, 2015

(54) DRIVING METHOD OF LIGHT SOURCE APPARATUS

(71) Applicant: Olympus Corporation, Tokyo (JP)

(72) Inventors: Takeshi Ito, Hino (JP); Masahiro Nishio, Hachioji (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 14/027,292

(22) Filed: Sep. 16, 2013

(65) Prior Publication Data

US 2014/0015413 A1 Jan. 16, 2014

Related U.S. Application Data

(63) Continuation of application No. PCT/JP2012/057966, filed on Mar. 27, 2012.

(30) Foreign Application Priority Data

Mar. 29, 2011 (JP) .................................. 2011-073037

(51) Int. Cl.
| | |
|---|---|
| *G01J 1/04* | (2006.01) |
| *G01N 21/64* | (2006.01) |
| *H05B 37/02* | (2006.01) |
| *G02B 6/42* | (2006.01) |
| *H01S 5/068* | (2006.01) |
| *G02B 6/26* | (2006.01) |
| *G02B 6/36* | (2006.01) |
| *H01S 5/00* | (2006.01) |
| *H01S 5/022* | (2006.01) |

(52) U.S. Cl.
CPC .............. *H05B 37/02* (2013.01); *G02B 6/4286* (2013.01); *H01S 5/06825* (2013.01); *G02B 6/26* (2013.01); *G02B 6/3624* (2013.01); *H01S 5/005* (2013.01); *H01S 5/02284* (2013.01)
USPC ..................... 362/552; 250/227.16; 250/461.1

(58) Field of Classification Search
CPC ................................... G01J 1/04; G01N 21/64
USPC ................. 250/201.1, 201.2, 227.15, 227.17, 250/227.18, 458.1, 459.1, 461.1, 461.2, 250/467.1; 362/552, 553, 554
See application file for complete search history.

(56) References Cited

U.S. PATENT DOCUMENTS

| | | | |
|---|---|---|---|
| 7,174,057 B2 * | 2/2007 | Shimizu et al. .................... 385/1 |
| 7,780,326 B2 * | 8/2010 | Ito ................................. 362/554 |
| 2013/0140443 A1 * | 6/2013 | Chikamori .............. 250/214 LA |

FOREIGN PATENT DOCUMENTS

| | | |
|---|---|---|
| JP | 3-118027 A | 5/1991 |
| JP | 2002-048948 A | 2/2002 |
| JP | 2008-122838 A | 5/2008 |
| JP | 2008-301874 A | 12/2008 |

* cited by examiner

*Primary Examiner* — Minh D A
(74) *Attorney, Agent, or Firm* — Scully, Scott, Murphy & Presser, PC

(57) ABSTRACT

A driving method of a light source apparatus includes causing a primary light source to emit checking light. The checking light has light intensity sufficient to check a state of the light source apparatus and unharmful to the human body even when the checking light leaks. This emission is based on an output signal from a photodetector having detected a light radiated from a light conversion unit. The method further includes checking a state of the light source apparatus. The checking the state of the light source apparatus is based on an output signal from the photodetector having detected light radiated from the light conversion unit and entering the photodetector based on the checking light.

13 Claims, 6 Drawing Sheets

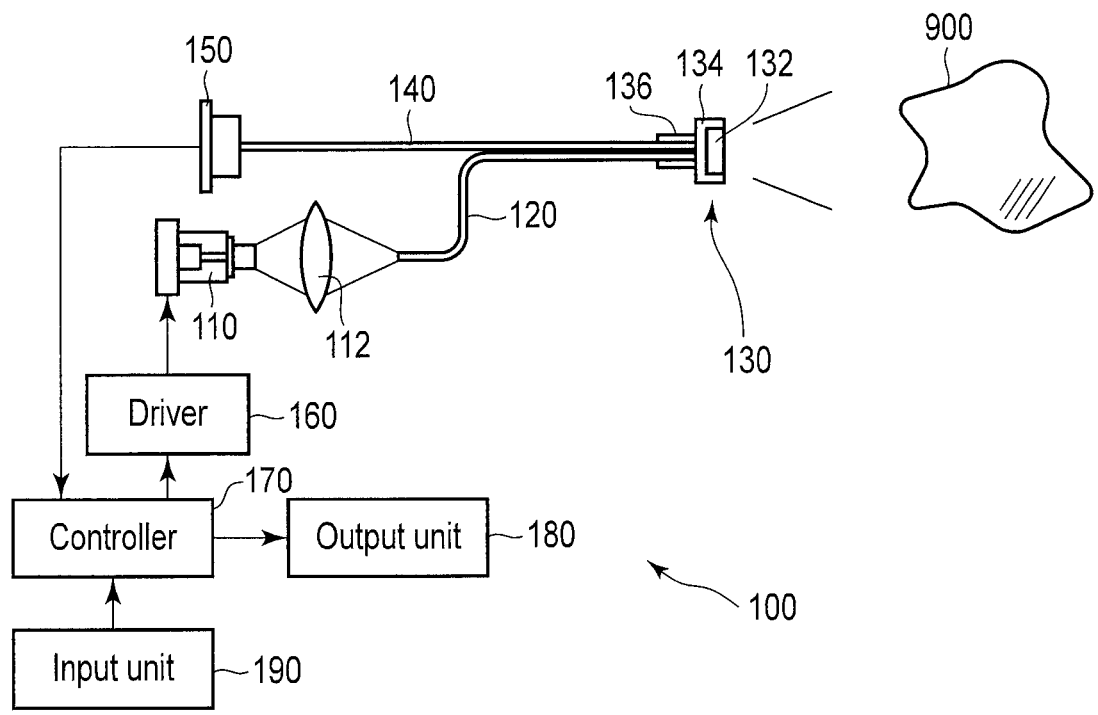
F I G. 1
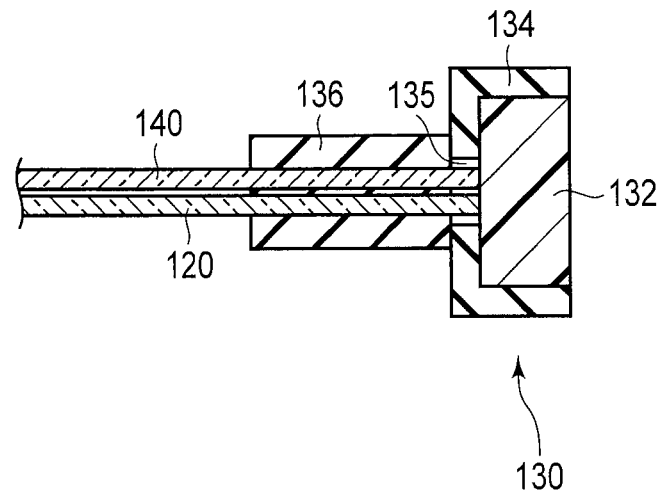
F I G. 2

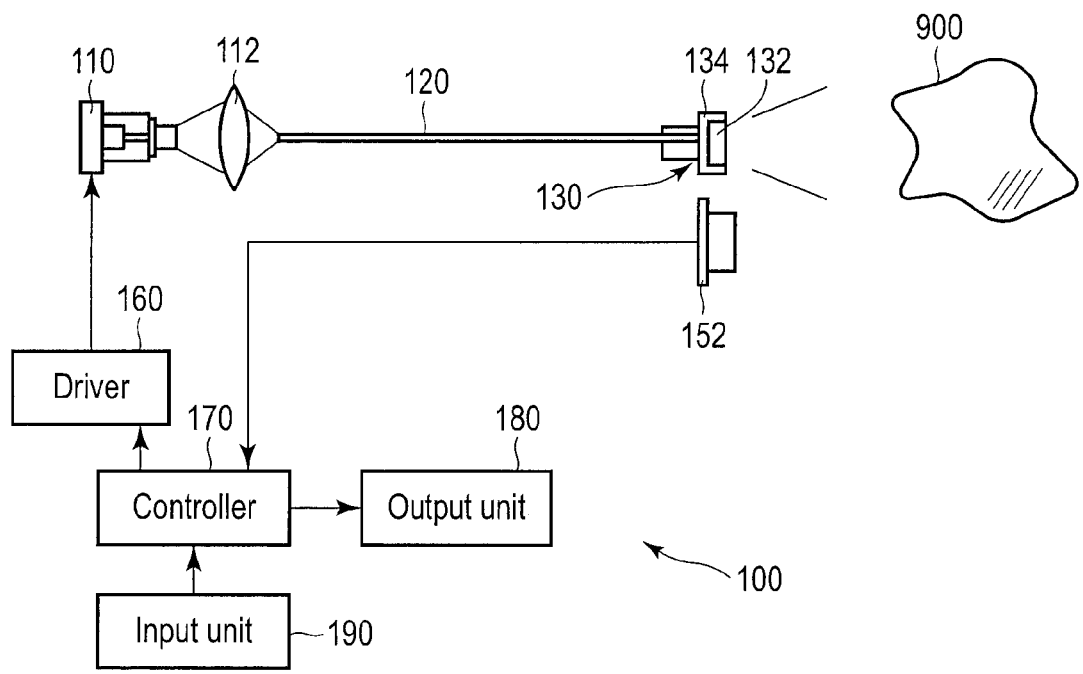
F I G. 7
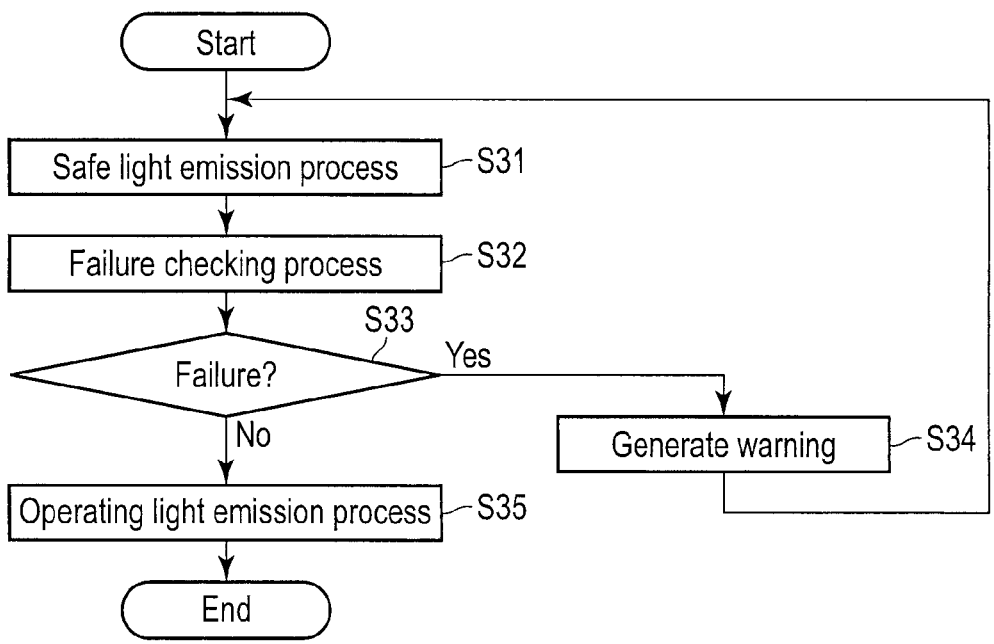
F I G. 8

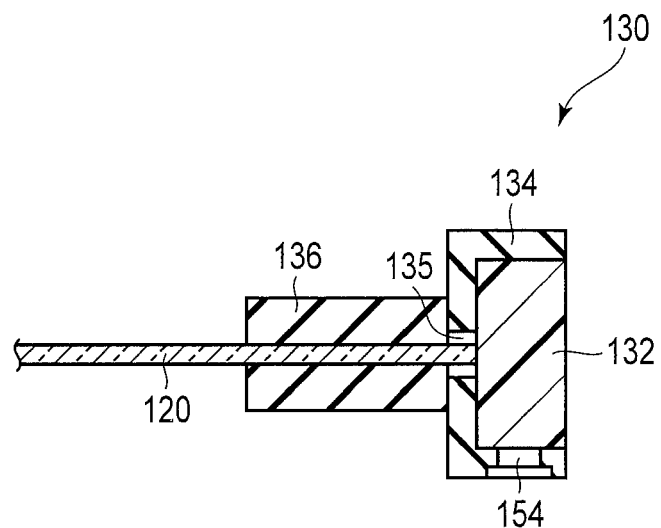
F I G. 9
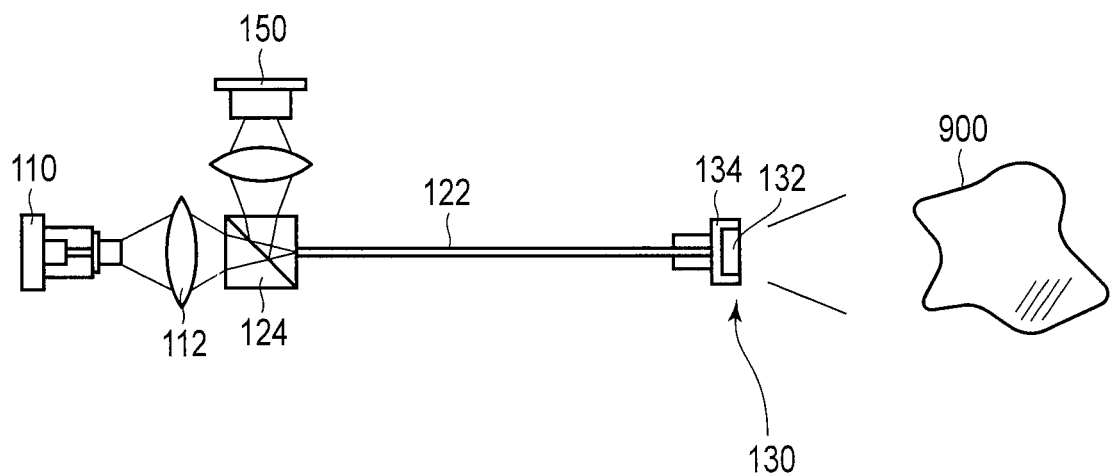
F I G. 10

DRIVING METHOD OF LIGHT SOURCE APPARATUS

CROSS REFERENCE TO RELATED APPLICATIONS

This application is a Continuation application of PCT Application No. PCT/JP2012/057966, filed Mar. 27, 2012 and based upon and claiming the benefit of priority from prior Japanese Patent Application No. 2011-073037, filed Mar. 29, 2011, the entire contents of all of which are incorporated herein by reference.

BACKGROUND OF THE INVENTION

1. Field of the Invention

The present invention relates to a driving method of a light source apparatus.

2. Description of the Related Art

The following light source module is generally known. A primary light unit such as a laser diode (LD) emits primary light. This primary light is guided to a wavelength converting member through an optical fiber. The wavelength converting member converts the guided primary light into secondary light having a desired wavelength. Since, however, the guided primary light is not entirely converted into the secondary light, the light source module emits the primary light and the converted secondary light as illuminating light.

An example of the light source module as described above is disclosed in Jpn. Pat. Appln. KOKAI Publication No. 2008-122838. In a light-emitting apparatus disclosed in Jpn. Pat. Appln. KOKAI Publication No. 2008-122838, a portion of the secondary light emitted from the wavelength converting member, which is not used as illuminating light, is guided to a light-receiving element through an optical fiber different from the optical fiber for guiding the primary light. This light-receiving element detects the guided light, and outputs a signal corresponding to the light intensity. In the optical system as described above, the intensity of light arriving at the light-receiving element changes if a failure such as disconnection of one of the optical fibers occurs. The light-emitting apparatus disclosed in Jpn. Pat. Appln. KOKAI Publication No. 2008-122838 detects a failure of the apparatus based on the signal corresponding to the light intensity and output from the light-receiving element.

BRIEF SUMMARY OF THE INVENTION

In the operation of detecting a failure in the technique disclosed in Jpn. Pat. Appln. KOKAI Publication No. 2008-122838, a light source emits primary light. If an optical system has a failure, for example, this primary light emitted for failure detection may leak from the failed portion. If the intensity of the leakage light is high, the light may do harm to the human body.

It is, therefore, an object of the present invention to provide a driving method of a light source apparatus from which no light that may do harm to the human body leaks.

To achieve the above described object, according to an aspect of the invention, a driving method of a light source apparatus comprising a primary light source, an optical fiber configured to guide primary light emitted from the primary light source, a light conversion unit configured to receive the primary light emitted from the primary light source and guided by the optical fiber, and convert at least one of a peak wavelength, a spectral shape, a radiation angle, and a light intensity included in optical properties of the primary light, and a photodetector configured to detect light radiated from the light conversion unit, the method includes causing the primary light source to emit checking light having light intensity sufficient to check a state of the light source apparatus and unharmful to a human body even when the checking light leaks, based on an output signal from the photodetector having detected the light radiated from the light conversion unit; and checking the state of the light source apparatus based on the output signal from the photodetector having detected light radiated from the light conversion unit and entering the photodetector based on the checking light.

According to the present invention, the presence/absence of a failure is determined by using light having intensity unharmful to the human body. This makes it possible to provide a driving method of a light source apparatus from which no light that may do harm to the human body leaks.

Advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a view showing an outline of a configuration example of an embodiment of a light source apparatus according to the first embodiment of the present invention;

FIG. 2 is a sectional view showing an outline of a configuration example of a wavelength conversion unit of the first embodiment;

FIG. 7 is a view showing an outline of a configuration example of an embodiment of a light source apparatus according to the second embodiment of the present invention;

FIG. 8 is a flowchart showing an operation example of the light source apparatus according to the second embodiment;

FIG. 9 is a sectional view showing an outline of a configuration example of a wavelength conversion unit of the third embodiment; and FIG. 10 is a view showing an outline of a configuration example of an optical system of the fourth embodiment.

DETAILED DESCRIPTION OF THE INVENTION

First Embodiment

Figure 3:
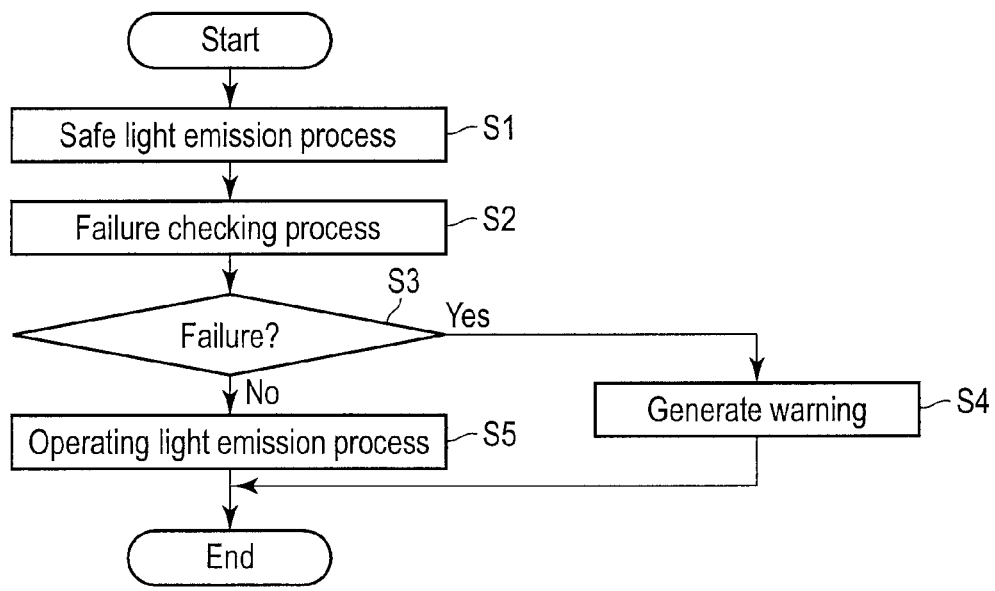
FIG. 3 is a flowchart showing an operation example of the light source apparatus according to the first embodiment.

The first embodiment of the present invention will be explained below with reference to the accompanying drawing. FIG. 1 shows a configuration example of a light source apparatus 100 according to this embodiment. The light source apparatus 100 includes an excitation light source 110, lens 112, first optical fiber 120, wavelength conversion unit 130, second optical fiber 140, light-receiving element 150, driver 160, controller 170, output unit 180, and input unit 190.

The excitation light source 110 is, for example, a laser diode, and emits excitation light. The emitted excitation light is condensed by the lens 112, and enters the first optical fiber 120. Since a laser diode is used as the excitation light source 110, the emitted excitation light efficiently enters the first optical fiber. The first optical fiber 120 guides the excitation light emitted from the excitation light source 110 to the wavelength conversion unit 130.

The wavelength conversion unit 130 includes a fluorescent material 132 fixed to a holding member 134. The excitation light guided by the first optical fiber 120 irradiates the fluorescent material 132 of the wavelength conversion unit 130. The fluorescent material 132 irradiated with the excitation light absorbs the excitation light, and emits fluorescence. The wavelength conversion unit 130 irradiates an illumination target object 900 with the fluorescence emitted by the fluorescent material 132 and the excitation light not absorbed by the fluorescent material 132.

The second optical fiber 140 guides a portion of the fluorescence emitted by the fluorescent material 132, and a portion of the excitation light reflected and scattered by the fluorescent material 132, from the wavelength conversion unit 130 to the light-receiving element 150. The light-receiving element 150 detects the light guided by the second optical fiber 140, and outputs a signal corresponding to the light intensity. The light-receiving element 150 is so designed as to be able to independently detect the intensity of the excitation light and that of the fluorescence.

FIG. 2 shows a sectional view in a plane of the wavelength conversion unit 130, which includes the central axes of the first and second optical fibers 120 and 140. The wavelength conversion unit 130 includes the fluorescent material 132 as a wavelength converting member, the holding member 134, and a ferrule 136. The holding member 134 has a cavity, and the fluorescent material 132 is placed in this cavity. The first optical fiber 120 is fixed as it is inserted into a through hole 135 of the holding member 134. Like the first optical fiber 120, the second optical fiber 140 is fixed as it is inserted into the through hole 135 of the holding member 134. The first and second optical fibers 120 and 140 are arranged along each other and held by the same ferrule 136.

The driver 160 is a driving circuit for causing the excitation light source 110 to emit light by supplying an electric current to the excitation light source 110. The controller 170 is connected to the driver 160, light-receiving element 150, output unit 180, and input unit 190. The controller 170 controls the operation of the whole light source apparatus 100. For example, the controller 170 controls the operation of the driver 160, thereby adjusting, for example, the light intensity and light emission time of the excitation light source 110. Also, the controller 170 receives a signal from the light-receiving element 150, and acquires the state of the light source apparatus 100. Furthermore, the controller 170 outputs, to the output unit 180, a signal pertaining to information to be transmitted to the user. In addition, the controller 170 acquires, from the input unit 190, a signal pertaining to an instruction from the user.

The output unit 180 is, for example, a display or loudspeaker, and outputs information to be transmitted to the user based on an instruction from the controller 170. The transmission method can be a method of displaying characters or figures on the display, or a method of generating a sound from the loudspeaker. The input unit 190 is, for example, a keyboard, mouse, touch panel, button switch, or slider. The input unit 190 receives an instruction from the user, and outputs a signal based on the instruction to the controller 170.

As described above, the excitation light source 110 functions as, for example, a primary light source. The wavelength conversion unit 130 functions as, for example, a light conversion unit that converts at least one of the peak wavelength, spectral shape, radiation angle, and light intensity. The light-receiving element 150 functions as, for example, a photodetector for detecting light radiated from the light conversion unit.

Next, the operation of the light source apparatus 100 will be explained. The controller 170 controls the operation of the light source apparatus 100. After the power supply of the light source apparatus 100 is turned on, the controller 170 first checks the presence/absence of a failure of the light source apparatus 100, i.e., checks whether the light source apparatus 100 is sufficiently safe. If the light source apparatus 100 is found to have no failure, the controller 170 operates the light source apparatus 100 so as to emit light in a use state. These operations will be explained in order with reference to a flowchart shown in FIG. 3.

In step S1, the controller 170 executes a safe light emission process. In this process, the controller 170 causes the excitation light source 110 to emit checking light having the following intensity. The intensity of the checking light is sufficiently high to such an extent that the light-receiving element 150 can detect light deriving from the light emitted from the excitation light source 110. As will be described later, this light intensity is set by taking account of, for example, the sensitivity of the light-receiving element 150, the ratio of incidence to an optical path, and attenuation in the optical path. In addition, as will be described later, the intensity of the checking light is low to such an extent that the amount of light emitted from the excitation light source 110 is sufficiently unharmful to the human body. In this embodiment, the checking light intensity meeting the above conditions is set based on the light intensity of the excitation light source 110 with which the light intensity is highest.

The checking light emitted from the excitation light source 110 is guided to the fluorescent material 132 in the wavelength conversion unit 130 by the first optical fiber 120. The fluorescent material 132 receives the guided checking light, and emits fluorescence corresponding to the light intensity of the radiated checking light. Most of the fluorescence irradiates the illumination target object 900. A portion of the fluorescence emitted by the fluorescent material 132 enters the second optical fiber 140. A portion of the excitation light reflected and scattered by the fluorescence material 132 also enters the second optical fiber 140. The light having entered the second optical fiber 140 is guided to the light-receiving element 150. The light-receiving element 150 receives the light guided by the second optical fiber 140.

"The light intensity sufficiently high to such an extent that the light-receiving element 150 can detect the light intensity", which defines the light intensity of the checking light, is a light intensity by which the intensity of light radiated to the fluorescent material 132 through the first optical fiber 120 and guided from the fluorescent material 132 to the light-receiving element 150 through the second optical fiber 140 exceeds the lower detection limit of the light-receiving element 150. A light intensity emitted from the excitation light source 110 and equal to the lower detection limit of the light-receiving element 150 will be referred to as a light detecting means lower-limit radiation power hereinafter. That is, in this embodiment, the light intensity emitted from the excitation light source 110 exceeds the light detecting means lower-limit radiation power.

Also, "the light intensity low to such an extent that the light intensity is sufficiently unharmful to the human body", which defines the light intensity of the checking light, is as follows. When the human body is directly irradiated with light, it receives a bad influence if a given threshold is exceeded. A maximum permissible exposure (MPE) is known as a standard of this threshold. The MPE is a standard determined based on information obtained from past accidents and experimental researches using animals. Two types of values are known as the MPE. That is, the value for the eye that is most sensitive to light in the human body, and the value for the skin as a portion other than the eye. It is necessary to carefully determine whether to use the value for the eye or the value for the skin as a standard, based on, for example, the use environment of the light source apparatus and the skill of an operator.

Table 1 shows the MPE for the eye and the MPE for the skin for light having a wavelength of 400 to 700 nm, when the exposure time is 1 ns to 18 μs, and 18 μs to 10 s. C6 is a relaxation coefficient corresponding to an aperture diameter through which the light is emitted. When the aperture diameter is 150 μm or less, the condition is severest, i.e., C6=1. The value of C6 decreases as the aperture diameter increases. Also, t indicates the exposure time.

TABLE 1

| | Exposure time | |
|---|---|---|
| | 1 [nsec]-18 [μsec] | 18 [μsec]-10 [sec] |
| MPE for eye | $5 \times 10^{-3} \cdot C6$ [J/m$^2$] | $18 \cdot t^{0.75} \cdot C6$ [J/m$^2$] |
| MPE for skin | 200 [J/m$^2$] | $1.1 \times 10^4 \cdot t^{0.25}$ [J/m$^2$] |

As shown in Table 1, the MPE is generally given as the relationship between the exposure time and the radiation energy of light radiated per unit area, i.e., the radiation exposure (unit: J/m$^2$). That is, the MPE is determined not by the radiation energy itself of light emitted from the light source apparatus, but by the radiation energy and exposure time with which the surface of the human body is irradiated with the light. In this embodiment, a shortest distance between the excitation light source and body surface is assumed by taking account of the use conditions, and the radiation energy and exposure time are set such that a value calculated from the radiation energy and exposure time is less than or equal to the MPE.

Figure 4:
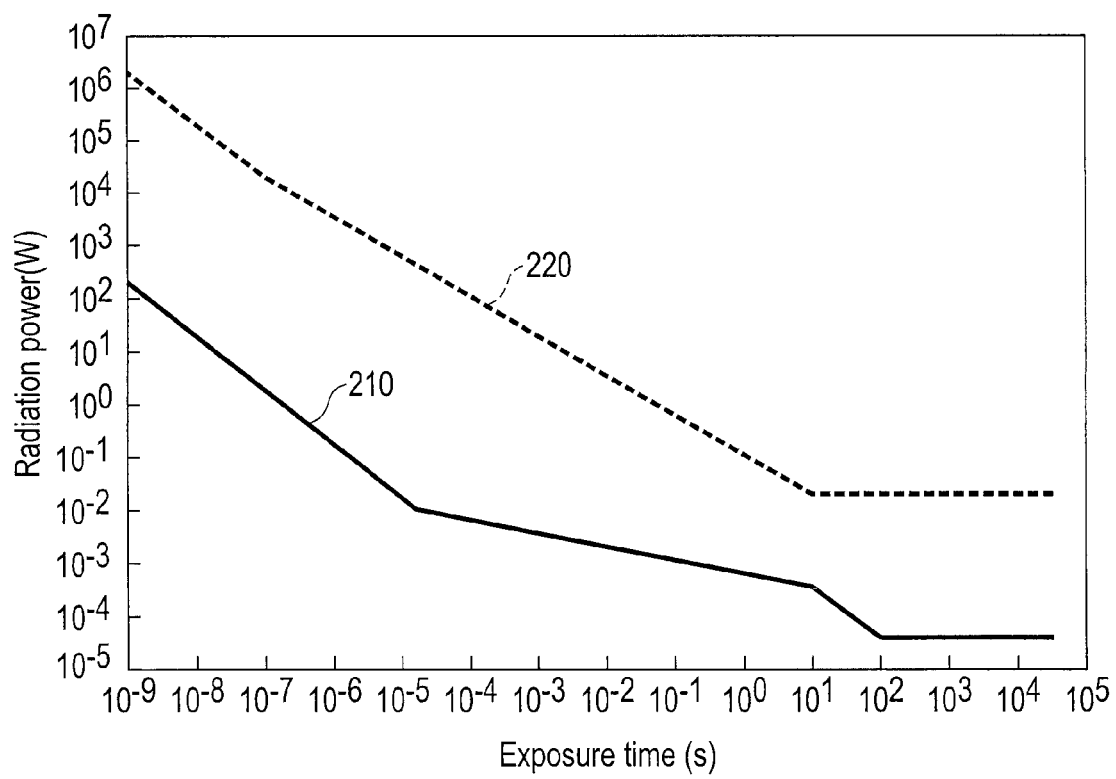
FIG. 4 is a view showing an example of the relationship between the radiation power representing a maximum permissible exposure and the exposure time.

FIG. 4 shows the relationship (MPE) between the radiation power [W] and exposure time [s]. Since the diameter of the optical fiber used in the apparatus is, for example, 50 μm, the emission diameter of the light source is set to 150 μm or less, i.e., C6=1. Also, when converting the radiation exposure (unit: J/m$^2$) into the radiation power (W), the eye measurement aperture diameter is set to 7 mm, and the area is set to $3.85 \times 10^{-5}$ [m$^2$]. The skin measurement aperture diameter is set to 3.5 mm, and the area is set to $9.62 \times 10^{-6}$ [m$^2$]. Referring to FIG. 4, a solid line 210 indicates the MPE for the eye, and a broken line 220 indicates the MPE for the skin. As shown in FIG. 4, the MPEs of the eye and skin have a two to four orders of magnitude difference.

In this embodiment, for example, the checking light must have optical power greater than or equal to the light detecting means lower-limit radiation power. Therefore, the light intensity of the checking light is first defined to be greater than or equal to the light detecting means lower-limit radiation power, in accordance with the lower limit of optical power detectable by the light-receiving element 150 to be used. Then, the exposure time is set such that the radiation exposure on the body surface is less than or equal to the MPE, for light having a light intensity greater than or equal to the light detecting means lower-limit radiation power.

This embodiment uses the MPE for the eye having a small permissible exposure amount. The light intensity of the checking light to be radiated from the excitation light source 110 is set such that the MPE is not exceeded even if the checking light radiated from the excitation light source 110 entirely enters the eye. For example, a value meeting this condition is a combination of the radiation power and exposure time corresponding to a range below the solid line 210 indicating the MPE for the eye in FIG. 4. For example, when the optical power is 1 mW, the MPE is not exceeded if the exposure time is about 0.1 s or less.

The explanation will be continued by referring back to the flowchart shown in FIG. 3. In step S2, the controller 170 executes a failure checking process. The controller 170 checks whether the light source apparatus 100 has a failure based on light received by the light-receiving element 150. In this failure checking process, the light intensity of fluorescence, the light intensity of excitation light reflected and scattered by the fluorescent material 132 and mixed in the fluorescence, the intensity ratio of the fluorescence to the excitation light, and the like are used as criteria for determining the presence/absence of a failure.

For example, the permissible range of the light intensity ratio of the excitation light to the fluorescence is prestored, and, if the detected light intensity ratio of the excitation light to the fluorescence falls within the permissible range, the controller 170 determines that the light source apparatus 100 has no failure. Alternatively, the controller 170 compares the light intensity ratio of the excitation light to the fluorescence detected by the last failure checking process with the light intensity ratio detected by the failure checking process this time. If the change amount is less than or equal to a permissible value, the controller 170 determines that the light source apparatus 100 has no failure.

Also, if the light intensity of fluorescence received by the light-receiving element 150 is smaller than the permissible lower limit or almost no fluorescence is detected, the first or second optical fiber 120 or 140 may be broken or the fluorescent material 132 may be removed. Therefore, if the light intensity of fluorescence received by the light-receiving element 150 is smaller than the permissible value, the controller 170 determines that the light source apparatus 100 has a failure. Furthermore, if the light intensity of excitation light received by the light-receiving element 150 is larger than the permissible upper limit, or if the light intensity ratio of the excitation light to the fluorescence received by the light-receiving element 150 exceeds the permissible range, various failures may have occurred. Accordingly, the controller 170 determines that the light source apparatus 100 has a failure in this case as well. In addition, the light-receiving element 150 may have a failure if neither the excitation light nor the fluorescence is detected. In this case, therefore, the controller 170 determines that the light source apparatus 100 has a failure.

A failure of the excitation light source 110 can be detected by a well-known method of checking the current-voltage characteristic of the excitation light source 110, or a well-known method of using a photodiode for monitoring in addition to the excitation light source 110. Accordingly, a failure of the light source apparatus 100 can also be detected by additionally using the method of checking the current-voltage characteristic or the method of using a photodiode for monitoring.

In step S3, the controller 170 determines whether a failure is detected in step S2. If it is determined that the light source apparatus 100 has a failure, the process advances to step S4. In step S4, the controller 170 warns the user of the failure by using the output unit 180. In this step, the warning can be performed by generating an alarm sound by using a loudspeaker as the output unit 180. Alternatively, the warning can be performed by displaying characters or images for warning by using a display as the output unit 180. After generating the warning, the controller 170 stops the operation of the light source apparatus 100, which includes the stop of the emission of excitation light from the excitation light source 110. The light source apparatus 100 can be designed to stop its operation without warning, and can also be designed to continue warning without stopping.

On the other hand, if it is determined in step S3 that the light source apparatus 100 has no failure, the process advances to step S5. In step S5, the controller 170 executes an operating light emission process. In this operating light emission process, excitation light having light intensity higher than that of the checking light having safe light intensity and output in the abovementioned safe light emission process can be emitted from the excitation light source 110. The output level of this excitation light is set based on, for example, a user's instruction acquired from the input unit 190, such that the intensity of light emitted from the wavelength conversion unit 130 is the light intensity desired by the user. The user performs a desired work under illumination output by the operating light emission process. When the user terminates the operating light emission process, the controller 170 terminates the series of processes.

As described above, the safe light emission process in step S1 functions as, for example, a process of causing the primary light source to emit the checking light. The failure checking process in step S2 and the determination in step S3 function as, for example, a process of checking the state of the light source apparatus.

In this embodiment, safety check for a light leak from the light source apparatus 100 is performed without user's notice. This safety check is performed using the safe light having a safe light intensity based on the MPE. If a failure of the light source apparatus 100 is detected, the light source apparatus 100 stops. Even if the light source apparatus 100 has a failure, therefore, leakage light is light having a light intensity smaller than that of the safe light, and no dangerous light leaks. When the safety is confirmed, the light source apparatus 100 normally functions as an apparatus that emits intense light desired by the user. This embodiment thus provides the light source apparatus 100 from which no light that may do harm to the human body leaks.

Note that the MPE for the eye is used as the light intensity standard of the safe light in this embodiment, but the standard is not limited to the MPE. For example, it is possible to use the accessible emission limit (AEL) defined by JIS C 6802 (2005) or IEC60825-1, the entire contents of which are incorporated herein by reference. While the MPE is the maximum permissible exposure to the human body, the AEL is defined as the permissible limit of a light intensity radiated from a light source apparatus based on the MPE. The AEL is defined as, for example, class 1, class 1M, class 2, class 2M, and the like in accordance with the user environment of the light source, the presence/absence of protective equipment. For example, when the AEL is class 1, no harm is done even if a person directly observes a beam. When the AEL is class 2M, no harm is done as long as a person does not directly observe a beam by using an optical device.

In this embodiment, it is possible to use, for example, this AEL as the light intensity standard of the safe light. For example, the light intensity standard of the safe light need only satisfy one of class 1, class 1M, class 2, and class 2M. By using the AEL as the standard, the definition of a safe light intensity can be obtained from the Japanese Industrial Standards (JIS) or standard of the International Electrotechnical Commission (IEC). Consequently, the light source apparatus can be managed and used in the same manner as that for other light source apparatuses, and this improves the convenience.

First Modification of First Embodiment

Figure 5:
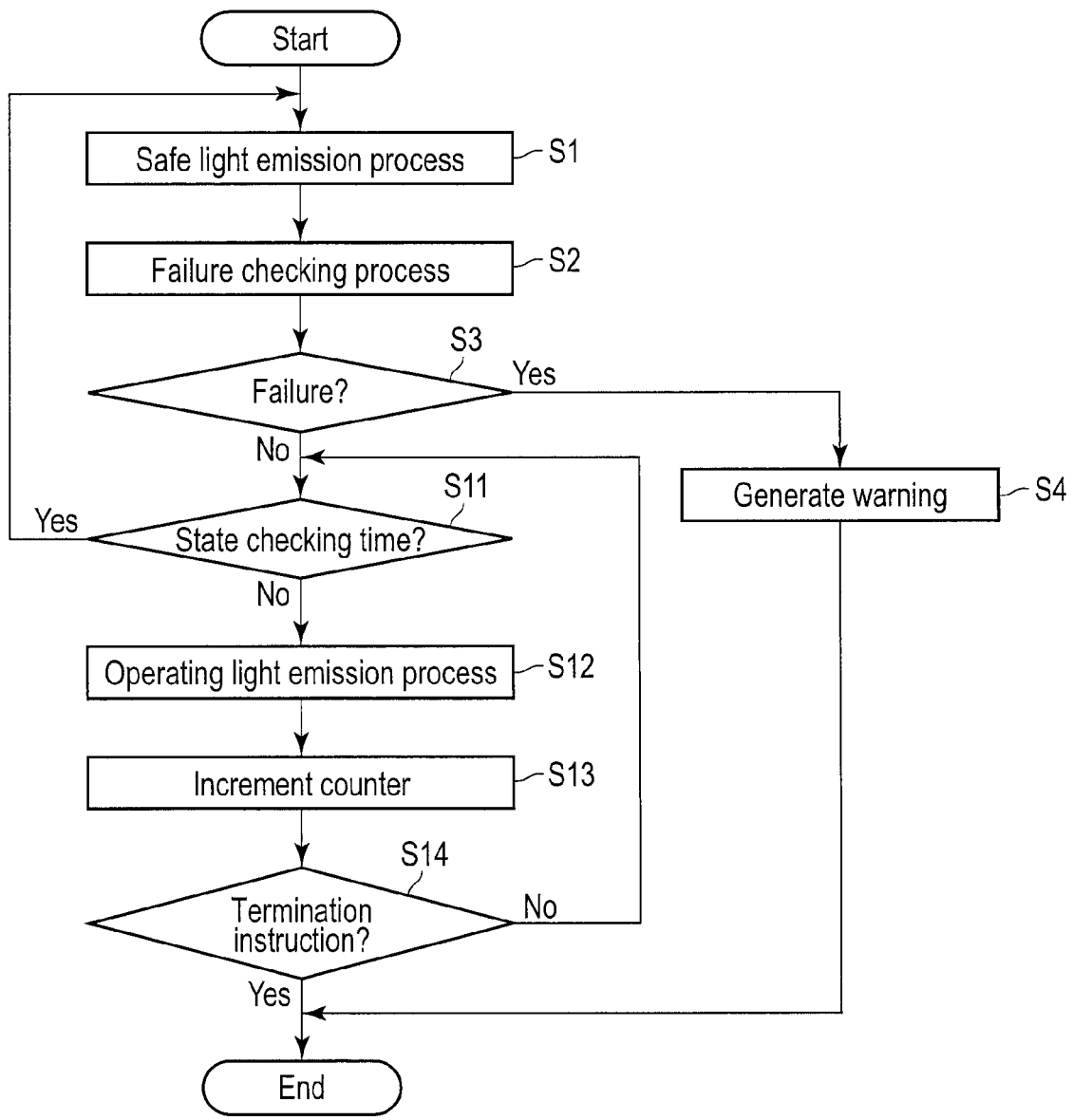
FIG. 5 is a flowchart showing an operation example of a light source apparatus according to the first modification of the first embodiment.

The first modification of the first embodiment will be explained. In this modification, a difference from the first embodiment will be explained, and the same parts are denoted by the same reference numbers and will not be explained. In this modification, a state checking process including the safe light emission process in step S1, the failure checking process in step S2, and the determination in step S3 is executed at a predetermined time interval. FIG. 5 shows a flowchart of the process according to this modification. In this modification, processes in steps S1 to S4 are the same as those of the first embodiment, and step S5 according to the first embodiment is replaced with steps S11 to S14.

In step S1, the controller 170 executes the safe light emission process, i.e., causes the excitation light source 110 to emit checking light having a light intensity sufficiently detectable by the light-receiving element 150 and a level sufficiently unharmful to the human body. In step S2, the controller 170 executes the failure checking process, i.e., checks whether the light source apparatus 100 has a failure based on the intensity of light received by the light-receiving element 150.

In step S3, the controller 170 determines whether a failure is detected in step S2. If it is determined that the light source apparatus 100 has a failure, the process advances to step S4. In step S4, the controller 170 warns the user of the failure of the light source apparatus 100 via an alarm or display device (not shown), and stops the operation of the light source apparatus 100.

On the other hand, if it is determined in step S3 that the light source apparatus 100 has no failure, the controller 170 advances the process to step S11. In step S11, the controller 170 determines, based on a counter, whether this is the execution timing of the state checking process in steps S1 to S3. If it is determined that this is the execution timing of the state checking process, the controller 170 resets the counter, and the process returns to step S1. On the other hand, if this is not the execution timing of the state checking process, the process advances to step S12.

In step S12, the controller 170 executes the same operating light emission process as that in step S5 of the first embodiment. In step S13, the controller 170 increments the counter. In step S14, the controller 170 determines whether an instruction for terminating the process is input from the user. If the instruction for terminating the process is input, the controller 170 terminates the process. If no instruction for terminating the process is input, the process returns to step S11.

By executing the process as in this modification, when the counter counted up in step S13 has reached a predetermined value, the process returns to step S1 from the determination in step S11. Accordingly, the state checking process in steps S1 to S3 is performed at a predetermined time interval, and the presence/absence of a failure of the light source apparatus 100 is checked. Consequently, if a failure occurs in the light source apparatus 100 even while the light source apparatus 100 is used in the operating light emission process, the process immediately advances to step S4, and the light source apparatus 100 can stop the operation by generating a warning. This makes the safety of the light source apparatus 100 higher than that in the first embodiment.

Second Modification of First Embodiment

Figure 6:
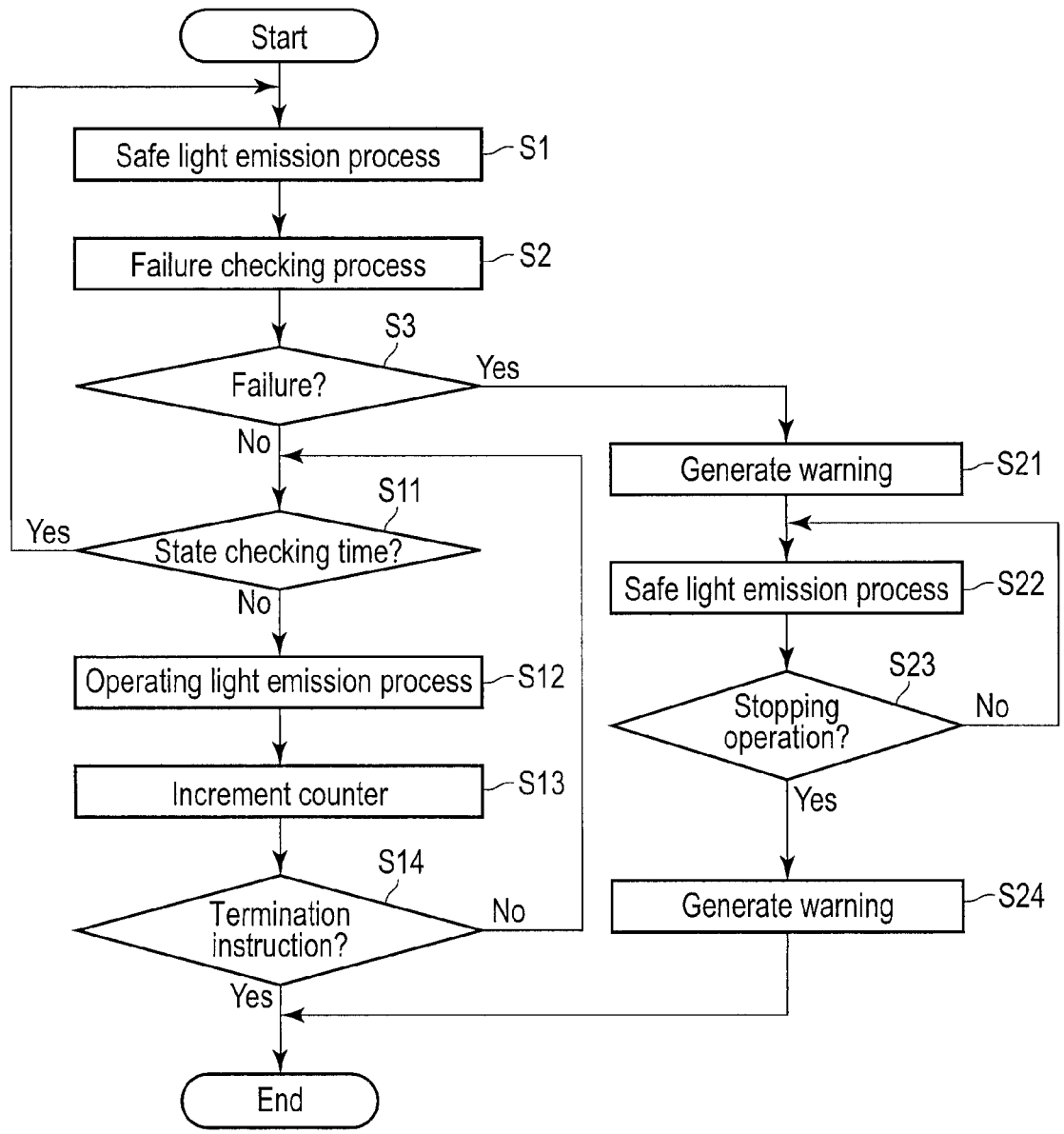
FIG. 6 is a flowchart showing an operation example of a light source apparatus according to the second modification of the first embodiment.

The second modification of the first embodiment will be explained. In this modification, a difference from the first modification will be explained, and the same portions are denoted by the same reference numbers and will not be explained. In this modification, if a failure of the light source apparatus 100 is detected, the safe light emission process is executed until an instruction is input from the user. FIG. 6 shows a flowchart of the process according to this modification. In this modification, processes in steps S1 to S3 and processes in steps S11 to S14 are the same as those of the first modification, and step S4 according to the first modification is replaced with steps S21 to S24.

In step S1, the controller 170 executes the safe light emission process, i.e., causes the excitation light source 110 to emit checking light having a light intensity sufficiently detectable by the light-receiving element 150 and a level sufficiently unharmful to the human body. In step S2, the controller 170 executes the failure checking process, i.e., checks whether the light source apparatus 100 has a failure based on the intensity of fluorescence received by the light-receiving element 150. In step S3, the controller 170 determines whether a failure is detected in step S2. If it is determined that the light source apparatus 100 has no failure, the process advances to step S11.

In step S11, the controller 170 determines, based on a counter, whether this is the execution timing of the state checking process. If it is determined that this is the execution timing of the state checking process, the controller 170 resets the counter, and the process returns to step S1. On the other hand, if this is not the execution timing of the state checking process, the process advances to step S12.

In step S12, the controller 170 executes the operating light emission process, as in step S5 of the first embodiment. In step S13, the controller 170 increments the counter. In step S14, the controller 170 determines whether an instruction for terminating the process is input from the user. If the instruction for terminating the process is input, the controller 170 terminates the process. If no instruction for terminating the process is input, the process returns to step S11.

On the other hand, if it is determined in step S3 that the light source apparatus 100 has a failure, the process advances to step S21. In step S21, the controller 170 generates a warning indicating the failure, as in step S4 of the first embodiment. In step S22, the controller 170 executes the same safe light emission process as that in step S1. That is, the controller 170 causes the excitation light source 110 to emit excitation light having safe intensity.

In step S23, the controller 170 determines whether an instruction for stop is input from the user. If it is determined that no instruction for stop is input, the process returns to step S22. On the other hand, if the instruction for stop is input, the process advances to step S24, and the controller 170 generates a warning in the same manner as in step S4 of the first embodiment, and stops the operation of the light source apparatus 100.

While the operating light emission process is performed in step S12, a portion where the wavelength conversion unit 130 of the light source apparatus 100 is positioned may be inserted into a dark place. Also, since the user performs a desired work under illumination by the wavelength conversion unit 130, an arbitrary tool may be placed around the wavelength conversion unit 130. Therefore, if the light is immediately completely turned off when a failure is detected, a trouble may occur in the portion where the wavelength conversion unit 130 is positioned or in the work of withdrawing the above-mentioned tool. By contrast, in this modification, if a failure is found in the light source apparatus 100, the safe light emission process of continuously emitting safe light as excitation light on a safe level is performed. Although the light intensity may be insufficient because the safe light emission process is performed, illumination can be maintained in the portion where the wavelength conversion unit 130 is positioned. In this modification as described above, it is possible to assist the withdrawing work in, for example, the portion where the wavelength conversion unit 130 is positioned, even when a failure is detected in the light source apparatus 100.

Third Modification of First Embodiment

The third modification of the first embodiment will be explained. In this modification, a difference from the first embodiment will be explained, and the same portions are denoted by the same reference numbers and will not be explained. In the first embodiment, the excitation light radiated from the excitation light source 110 is set to have a sufficiently safe light intensity. By contrast, in this modification, the light intensity radiated from the exit end of the first optical fiber 120 is set at a safe level, for example, at a level less than or equal to the MPE.

The excitation light emitted from the excitation light source 110 is condensed to the incident end of the first optical fiber 120 by the lens 112, and enters the first optical fiber 120. In this state, the incident ratio at which the excitation light emitted from the excitation light source 110 enters the first optical fiber 120 is not 100%. Therefore, the light intensity radiated from the exit end of the first optical fiber 120 is smaller than that radiated from the excitation light source 110.

When the intensity of checking light radiated from the first optical fiber 120 is less than or equal to the MPE, the light intensity emitted from the excitation light source 110 may be greater than or equal to the MPE. However, the connecting portion between the excitation light source 110 and first optical fiber 120 is generally covered and protected by a housing (not shown). Accordingly, there is almost no possibility that the checking light emitted from the excitation light source 110 is entirely radiated outside. When the intensity of the checking light radiated from the first optical fiber 120 is less than or equal to the MPE, therefore, the light intensity emitted from the excitation light source 110 may be greater than or equal to the MPE, but there is almost no possibility that the checking light having intensity greater than or equal to the MPE leaks from the portion where the excitation light source 110 is placed.

On the other hand, the light intensity can be made higher when it is set such that the intensity of the checking light radiated from the first optical fiber 120 is less than or equal to the MPE, than when it is set such that the intensity of the excitation light emitted from the excitation light source 110 is less than or equal to the MPE. As a consequence, it is possible to increase the light intensity of signal light to be received by the light-receiving element 150. Since the light intensity received by the light-receiving element 150 increases, the detection accuracy of the light-receiving element 150 rises, so the controller 170 can detect a failure of the light source apparatus 100 more accurately.

In this modification, a failure can be detected with accuracy higher than that of the first embodiment, in addition to the effect of the first embodiment.

Note that in this modification, it is assumed that the length of the optical fiber is a few meters to a few tens of meters. In this case, the light guiding loss caused by light guiding in the first optical fiber 120 is presumably much smaller than the incident loss when the excitation light emitted from the excitation light source 110 enters the first optical fiber 120. In this modification, therefore, the exit light intensity of the excitation light source 110 is set such that the light intensity radiated from the exit end of the first optical fiber 120 is less than or equal to the MPE and is safe. That is, even if the first optical fiber 120 is broken and the checking light leaks out from the broken portion, the light intensity is less than or equal to the MPE and is safe.

By contrast, when the first optical fiber 120 is extremely long or has a large light guiding loss, it is only necessary to appropriately set the exit light intensity of the excitation light source 110 by taking account of the safety when the first optical fiber 120 is broken and the checking light leaks from the broken portion. For example, based on the relationship between the light guiding loss of the first optical fiber 120 and the position where the first optical fiber 120 may be broken in accordance with the use state, the intensity of the checking light emitted from the excitation light source 110 can be set at a value intermediate between a value at which the intensity of the excitation light source 110 is the MPE and a value at which the intensity at the exit end of the first optical fiber 120 is the MPE.

Second Embodiment

The second embodiment of the present invention will be explained. In this embodiment, a difference from the first embodiment will be explained, and the same portions are denoted by the same reference numbers and will not be explained. In the first embodiment, the light source apparatus 100 has a configuration in which the second optical fiber 140 is positioned behind the fluorescent material 132, and the light-receiving element 150 detects light having entered and guided by the second optical fiber 140. By contrast, in this embodiment, a light source apparatus 100 has a configuration in which a light-receiving element detects excitation light and fluorescence emitted from the front side of a wavelength conversion unit 130 toward an illumination target object 900, and reflected and scattered by the illumination target object 900.

FIG. 7 shows a configuration example of the light source apparatus 100 according to this embodiment. As shown in FIG. 7, the light source apparatus 100 according to this embodiment does not include the second optical fiber 140 and light-receiving element 150 included in the first embodiment. On the other hand, a light-receiving element 152 is placed close to the wavelength conversion unit 130. The light-receiving element 152 is so designed as to be able to independently detect excitation light and fluorescence, and similar to the light-receiving element 150 of the first embodiment. The light-receiving element 152 is electrically connected to a controller 170. The rest of the configuration is the same as that of the first embodiment.

The operation of the light source apparatus 100 according to this embodiment will be explained. FIG. 8 shows a flowchart of processing according to this embodiment. Steps S31, S32, S33, S34, and S35 of this embodiment are respectively equivalent to steps S1, S2, S3, S4, and S5 of the first embodiment. This embodiment differs from the first embodiment in that if it is determined in step S33 that the light source apparatus 100 has a failure, a warning is generated in step S34, and the process returns to step S31.

That is, in step S31, the controller 170 executes a safe light emission process, i.e., causes an excitation light source 110 to emit checking light having a sufficient light intensity detectable by the light-receiving element 152 and a level sufficiently unharmful to the human body. In step S32, the controller 170 executes a failure checking process, i.e., checks whether the light source apparatus 100 has a failure based on fluorescence detected by the light-receiving element 152.

In step S33, the controller 170 determines whether a failure is detected in step S32. If it is determined that the light source apparatus 100 has a failure, the process advances to step S34. In step S34, the controller 170 informs the user of the possibility of a failure via an output unit 180. After that, the process returns to step S31.

On the other hand, if it is determined in step S33 that the light source apparatus 100 has no failure, the process advances to step S35. In step S35, the controller 170 executes an operating light emission process.

In this embodiment, the apparatus is so designed that the light-receiving element 152 detects illumination light reflected by the illumination target object 900. Accordingly, the intensity of the light detected by the light-receiving element 152 changes in accordance with the illumination target object 900, even when the light intensity emitted from the wavelength conversion unit 130 remains the same. In this embodiment, therefore, a standard procedure is to perform a state checking process in steps S31 to S33 by irradiating a standard reflecting sample such as a white plate with safe light. However, the standard reflecting sample is not necessarily irradiated with the safe light the moment the power supply is turned on.

In this embodiment, therefore, even when light weaker than a predetermined range is detected such as when the light source apparatus 100 has a failure, i.e., even when it is determined that there is a failure in the state checking process in steps S31 to S33, the light source apparatus 100 is not immediately stopped, and a warning indicating that the possibility of a failure is detected is generated in step S34, thereby continuing the safe light emission process. After that, the standard reflecting sample is irradiated with the safe light. If it is confirmed in the failure checking process that there is no failure, the process advances to the operating light emission process in step S35.

In this embodiment, the abovementioned configuration can be implemented in the existing light source apparatus including no light-receiving element, by only placing the light-receiving element 152 near a light-emitting unit such as the wavelength conversion unit 130, and connecting the light-receiving element 152 to the controller 170. The light-receiving element 152 can be integrated with, for example, the first optical fiber 120 and wavelength conversion unit 130, and can also be separated from them. Furthermore, in this embodiment, the use of the standard reflecting sample makes it possible to more accurately detect a failure of the light source apparatus 100.

Note that the operation method of the light source apparatus 100 according to this embodiment can be the method of periodically repeating the state checking process as explained with reference to FIG. 5, or the method of performing the safe light emission process when a failure is detected as explained with reference to FIG. 6.

Third Embodiment

The third embodiment of the present invention will be explained. In this embodiment, a difference from the first embodiment will be explained, and the same portions are denoted by the same reference numbers and will not be explained. FIG. 9 shows the configuration of a portion of a wavelength conversion unit 130 according to this embodiment. In this embodiment, as shown in FIG. 9, a light-receiving element 154 is formed in a position where the element faces a fluorescent material 132 of the wavelength conversion unit 130. The light-receiving element 154 is electrically connected to a controller 170. The rest of the configuration is the same as that of the first embodiment.

In this configuration, the light-receiving element 154 can directly detect fluorescence generated by the fluorescent material 132, and excitation light reflected and scattered by the fluorescent material 132. That is, in the first embodiment, fluorescence generated by the fluorescent material 132 and having entered the second optical fiber 140 and excitation light reflected and scattered by the fluorescent material 132 and having entered the second optical fiber 140 are measured. By contrast, in this embodiment, the effective light-receiving region of the light-receiving element 154 can be made larger than the aperture of the second optical fiber 140. Accordingly, the light-receiving element 154 can receive a larger amount of light, and the light source apparatus 100 can increase the detection accuracy.

Also, the second embodiment is affected by the color or the like of the illumination target object 900 because the light reflected and scattered by the illumination target object 900 is measured. By contrast, this embodiment can directly detect fluorescence generated by the fluorescent material 132 and excitation light reflected and scattered by the fluorescent material 132. This makes stable measurement possible without using any standard reflecting sample or the like. Note that the operation method of the light source apparatus 100 according to this embodiment is the same as that of the first embodiment and its modifications explained with reference to FIG. 3, 5, or 6.

Fourth Embodiment

The fourth embodiment of the present invention will be explained. In this embodiment, a difference from the first embodiment will be explained, and the same portions are denoted by the same reference numbers and will not be explained. FIG. 10 shows a configuration example of an optical system of a light source apparatus 100 according to this embodiment. The optical system of the light source apparatus 100 includes an excitation light source 110, optical fiber 122, splitting optical element 124, wavelength conversion unit 130, and light-receiving element 150.

Excitation light emitted by the excitation light source 110 passes through a lens 112 and the splitting optical element 124, enters the optical fiber 122, and is guided to the wavelength conversion unit 130 by the optical fiber 122. The excitation light guided by the optical fiber 122 irradiates a fluorescent material 132 of the wavelength conversion unit 130. The fluorescent material 132 absorbs the excitation light and emits fluorescence.

The optical fiber 122 guides a portion of the fluorescence emitted by the fluorescent material 132, and a portion of the excitation light reflected and scattered by the fluorescent material 132, from the wavelength conversion unit 130 to the splitting optical element 124. The splitting optical element 124 guides these light components to the light-receiving element 150. The light-receiving element 150 detects the guided light, and outputs a signal corresponding to the light intensity. The light-receiving element 150 is so designed as to be able to independently detect the excitation light and fluorescence. The rest of the configuration is the same as that of the first embodiment.

As described above, the first embodiment includes the first optical fiber 120 for guiding excitation light to the fluorescent material 132, and the second optical fiber 140 for guiding fluorescence emitted by the fluorescent material 132 to the light-receiving element 150. In this embodiment, however, the optical fiber 122 functions as both the first and second optical fibers 120 and 140.

This embodiment achieves the following effects in addition to the effect of the first embodiment. In this embodiment, the optical fiber 122 functions as both the first and second optical fibers 120 and 140 in the first embodiment. Accordingly, a thinner light source can be implemented in this embodiment. Also, the configuration near the wavelength conversion unit 130 can be made simpler than that of the first, second, or third embodiment. Therefore, the whole light source apparatus 100 can easily be miniaturized in this embodiment. Note that the operation method of the light source apparatus 100 according to this embodiment is the same as that of the first embodiment and its modifications explained with reference to FIG. 3, 5, or 6.

Note that the examples of the light source system combining the excitation light source and wavelength conversion unit are explained in all the embodiments of the present invention described above, but the present invention is not limited to these examples. The effects of the present invention can be obtained by a light source apparatus combining a primary light source, and a light conversion unit that converts at least some of the optical properties, such as the peak wavelength, radiation angle, spectral shape, and light intensity, of primary light radiated from the primary light source, and radiates the converted light as secondary light. In this case, the light source apparatus 100 includes the light conversion unit that includes a member for converting, for example, the peak wavelength, radiation angle, spectral shape, and light intensity of the primary light and radiates the secondary light, instead of or in addition to the wavelength conversion unit 130. The rest of the configuration and the operation are the same as those of the above-described embodiments. That is, the above-described embodiments are applicable to any light source apparatus, provided that the safety level of secondary light radiated from the light source apparatus is higher than the safety level when primary light is directly radiated. For example, even in a light source apparatus that improves the safety by widening the radiation angle of laser light as primary light, thereby reducing the light density of laser light entering the eye of the light source user, or a light source apparatus that changes the light intensity by, for example, an ND filter or polarizing plate inserted into an optical path, the same effects can be obtained by arranging and operating the apparatus in the same manner as in the above-described embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A driving method of a light source apparatus comprising a primary light source, an optical fiber configured to guide primary light emitted from the primary light source, a light conversion unit configured to receive the primary light emitted from the primary light source and guided by the optical fiber, and convert at least one of a peak wavelength, a spectral shape, a radiation angle, and a light intensity included in optical properties of the primary light, and a photodetector configured to detect light radiated from the light conversion unit, the method comprising:

causing the primary light source to emit checking light having light intensity sufficient to check a state of the light source apparatus and unharmful to a human body even when the checking light leaks, based on an output signal from the photodetector having detected the light radiated from the light conversion unit; and checking the state of the light source apparatus based on the output signal from the photodetector having detected light radiated from the light conversion unit and entering the photodetector based on the checking light.

2. The method according to claim 1, wherein the light intensity of the checking light, which is sufficient to check the state of the light source apparatus, is intensity at which power of light entering the photodetector is not less than a lower limit of power detectable by the photodetector.

3. The method according to claim 1, wherein the light intensity of the checking light, which is unharmful to the human body even when the checking light leaks, is intensity at which radiation energy of the checking light is not more than a maximum permissible exposure in a portion where the checking light is emitted from the optical fiber to the light conversion unit, the maximum permissible exposure being an optical energy amount as a criterion having no influence on the human body even when the human body is directly irradiated.

4. The method according to claim 3, wherein the light intensity of the checking light, which is unharmful to the human body even when the checking light leaks, is intensity at which radiation energy of the checking light emitted from the primary light source is not more than the maximum permissible exposure.

5. The method according to claim 3, wherein
radiation power of the checking light is determined such that power of light entering the photodetector is not less than a lower limit of optical power detectable by the photodetector, and
a radiation time of the checking light is determined such that the radiation energy obtained by the radiation power is not more than the maximum permissible exposure.

6. The method according to claim 5, wherein the maximum permissible exposure is a value set for an eye.

7. The method according to claim 5, wherein the checking light has radiation energy meeting one of class 1, class 1M, class 2, and class 2M described in IEC60825-1.

8. The method according to claim 1, wherein the checking the state of the light source apparatus is performed when a power supply of the light source apparatus is turned on.

9. The method according to claim 1, further comprising causing the primary light source to emit the primary light having light intensity higher than that of the checking light,
wherein the causing the primary light source to emit the primary light having light intensity higher than that of the checking light is performed when it is determined that the light source apparatus has no failure in the checking the state of the light source apparatus.

10. The method according to claim 9, wherein when it is determined that the light source apparatus has no failure in the checking the state of the light source apparatus, the causing the primary light source to emit the primary light having light intensity higher than that of the checking light is subsequently performed.

11. The method according to claim 9, wherein
the causing the primary light source to emit the checking light and the checking the state of the light source apparatus are inserted at a predetermined time interval while the causing the primary light source to emit the primary light having light intensity higher than that of the checking light is performed, and
if it is determined that the light source apparatus has a failure in the inserted checking the state of the light source apparatus, the light source apparatus is stopped or the primary light source is caused to emit the checking light.

12. The method according to claim 1, wherein if it is determined that the light source apparatus has a failure in the checking the state of the light source apparatus,
a user is informed of the failure, and
subsequently the primary light source is caused to emit the checking light.

13. The method according to claim 1, wherein if it is determined that the light source apparatus has a failure in the checking the state of the light source apparatus, a user is informed of the failure and/or the light source apparatus is stopped.

* * * * *